(12) United States Patent
Mu et al.

(10) Patent No.: US 11,869,898 B2
(45) Date of Patent: Jan. 9, 2024

(54) ARRAY SUBSTRATE AND DISPLAY DEVICE (71) Applicants: BEIJING BOE DISPLAY TECHNOLOGY CO., LTD., Beijing (CN); BOE Technology Group Co., Ltd., Beijing (CN)

(72) Inventors: Wenkai Mu, Beijing (CN); Shijun Wang, Beijing (CN); Yi Liu, Beijing (CN); Bo Feng, Beijing (CN); Yang Wang, Beijing (CN); Zhan Wei, Beijing (CN); Li Tian, Beijing (CN)

(73) Assignees: BEIJING BOE DISPLAY TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 544 days.

(21) Appl. No.: 17/259,200

(22) PCT Filed: Apr. 1, 2020

(86) PCT No.: PCT/CN2020/082822
§ 371 (c)(1),
(2) Date: Jan. 11, 2021

(87) PCT Pub. No.: WO2021/196089
PCT Pub. Date: Oct. 7, 2021

(65) Prior Publication Data
US 2022/0139961 A1    May 5, 2022

(51) Int. Cl.
*H01L 27/12* (2006.01)
*G02F 1/1362* (2006.01)
*G02F 1/1368* (2006.01)

(52) U.S. Cl.
CPC ...... *H01L 27/124* (2013.01); *G02F 1/136286* (2013.01); *G02F 1/1368* (2013.01)

(58) Field of Classification Search
CPC .................................................. H01L 27/124
See application file for complete search history.

(56) References Cited

U.S. PATENT DOCUMENTS

| 9,858,881 | B2 * | 1/2018 | Li | G09G 3/3648 |
| 2002/0196517 | A1 * | 12/2002 | Nimura | G02F 1/133553 |
| | | | | 359/245 |

(Continued)

FOREIGN PATENT DOCUMENTS

| CN | 106707532 A | 5/2017 |
| CN | 110456585 A | 11/2019 |

OTHER PUBLICATIONS

Office Action dated Jan. 5, 2023 for Indian Patent Application No. 202227062229 and English Translation.

*Primary Examiner* — William A Harriston
(74) *Attorney, Agent, or Firm* — Ling Wu; Stephen Yang; Ling and Yang Intellectual Property (57) ABSTRACT

An array substrate and display device are provided. The array substrate includes a base substrate, and gate lines, data lines, compensation blocks and sub-pixels located on the base substrate. Two gate lines are arranged between two adjacent rows of sub-pixels. The data lines are provided with multiple first extensions and second extensions arranged alternately. The extending direction of the first extensions intersects with the extending direction of the second extensions. The gate lines and data lines define multiple first pixel areas and second pixel areas on the base substrate. Two sub-pixels are arranged in the first pixel area, and one sub-pixel is arranged in the second pixel area. The multiple first pixel areas are arranged in an array, the multiple second pixel areas are arranged in two columns, and multiple columns of the first pixel areas are located between the two columns of the second pixel areas.

10 Claims, 9 Drawing Sheets

(56) References Cited

U.S. PATENT DOCUMENTS

| | | | |
|---|---|---|---|
| 2009/0213290 A1* | 8/2009 | Ochiai | G02F 1/136286 |
| | | | 349/48 |
| 2010/0039601 A1* | 2/2010 | Kim | G02F 1/136286 |
| | | | 438/30 |
| 2010/0314622 A1* | 12/2010 | Kuo | G02F 1/13624 |
| | | | 257/E21.535 |
| 2016/0041664 A1* | 2/2016 | Qin | G06F 3/0412 |
| | | | 345/173 |
| 2016/0266443 A1* | 9/2016 | Pang | G02F 1/133784 |
| 2016/0299614 A1* | 10/2016 | Yang | G09G 3/3655 |
| 2016/0327824 A1* | 11/2016 | Chen | G02F 1/136286 |
| 2017/0277008 A1* | 9/2017 | Jiang | G02F 1/133512 |
| 2018/0012907 A1* | 1/2018 | Cheng | G02F 1/136286 |
| 2018/0366492 A1* | 12/2018 | Zhou | H01L 27/124 |
| 2019/0027497 A1* | 1/2019 | Long | G02F 1/134363 |
| 2019/0235333 A1 | 8/2019 | Wang et al. | |
| 2021/0056924 A1 | 2/2021 | Xiao et al. | |

\* cited by examiner

ARRAY SUBSTRATE AND DISPLAY DEVICE

CROSS-REFERENCE TO RELATED APPLICATION

The present application is a U.S. National Phase Entry of International Application No. PCT/CN2020/082822 having an international filing date of Apr. 1, 2020. The above-identified application is incorporated into this application by reference in their entirety.

TECHNICAL FIELD

Embodiments of the present disclosure relate to, but are not limited to, the technical field of display, in particular to an array substrate and a display device.

BACKGROUND

A Liquid Crystal Display (LCD) is widely used in modern information equipment, such as monitors, televisions, mobile phones and digital products, because of its advantages of light weight, low power consumption, low radiation and portability. In order to narrow the frame of the display device and increase the screen-to-body ratio, a Dual Gate structure is used to drive the sub-pixels to emit light, that is, one data line drives two adjacent columns of sub-pixels to drive the sub-pixels. However, because the polarities of data signals obtained from two columns of sub-pixels connected with the same data line in a dual gate structure are the same, and the polarities of data signals obtained from sub-pixels connected with adjacent data lines are different, for the same type of sub-pixel in each row of pixel areas, the probability for the voltage polarity between any two adjacent sub-pixels being the same is nearly 50%, and for each column of sub-pixels, the voltage polarity of each sub-pixel is the same, so it is impossible to average the voltage polarity of the same type of sub-pixels in the same frame image on the spatial scale, and there will appear light and dark stripes visually, and therefore, there will be undesirable phenomenon of mura.

The method of dot inversion (that is, the polarity of data signals obtained from the same column of sub-pixels is arranged alternately) can eliminate the undesirable phenomenon of mura. However, this method makes the power consumption of the display device increase sharply, and makes one of the two sub-pixels of the data line being continuously charged charged well while the other charged poorly, which reduces the display effect of the display device.

SUMMARY

The following is a summary of subject matter described in detail herein. This summary is not intended to limit the protection scope of the claims.

The embodiments of the present disclosure provide an array substrate. The array substrate includes a base substrate, and multiple gate lines, multiple data lines, multiple compensation blocks and multiple sub-pixels located on the base substrate. Two gate lines are arranged between any two adjacent rows of sub-pixels. The data lines are provided with multiple first extensions and multiple second extensions arranged alternately. The extending direction of the first extensions intersects with the extending direction of the second extensions, and in the same data line, any two adjacent first extensions and the second extensions between the two adjacent first extensions constitute a pixel accommodating region. The gate lines and data lines define multiple first pixel areas and multiple second pixel areas on the base substrate. Two sub-pixels are arranged in each first pixel area, and one sub-pixel is arranged in each second pixel area. The multiple first pixel areas are arranged in an array, the multiple second pixel areas are arranged in two columns, and multiple columns of first pixel areas are located between the two columns of the second pixel areas. The pixel accommodating region includes at least one first pixel area and at least one second pixel area. The data lines include multiple first data lines and two second data lines. The multiple first data lines are located between the two second data lines. Projections of the second data lines on the base substrate and projections of the compensation blocks on the base substrate include overlapping areas.

In an exemplary embodiment, a first gate line and a second gate line are arranged between two adjacent rows of the sub-pixels, and the compensation blocks and the first gate line are connected with each other to form an integrated structure. The sub-pixels include thin film transistors and pixel electrodes, the thin film transistors include first poles, second poles and gate electrodes, the pixel electrodes are electrically connected with the second poles of the thin film transistors, the gate electrodes of the thin film transistors in the second pixel areas are electrically connected with the second gate lines, and the first poles of the thin film transistors in the second pixel areas are electrically connected with the second data lines, or the first data lines adjacent to the second data lines.

In an exemplary embodiment, the width of the compensation blocks in the extending direction of the first extensions is greater than or equal to the width of the data lines in the extending direction of the first extensions; the length of the compensation blocks in the extending direction of the second extensions is greater than or equal to the length of the gate electrodes in the extending direction of the second extensions, and the overlapping length of the compensation blocks and the second data lines in the extending direction of the second extensions is equal to the length of the compensation blocks in the extending direction of the second extensions.

In an exemplary embodiment, the second data lines and the first poles of the thin film transistors in the second pixel areas are connected with first nodes, the second data lines between two adjacent first nodes include first parts and second parts, the line width of the data lines of the second parts is smaller than that of the data lines of the first parts, orthographic projections of the second parts on the base substrate do not overlap with those of the compensation blocks on the base substrate, the orthographic projections of the second parts on the base substrate do not overlap with those of the gate electrodes on the base substrate, and the first parts are parts of the second data lines except the second parts.

In an exemplary embodiment, on the second data lines between two adjacent first nodes, the width ratio of the second parts to the first parts is between 1/3 and 2/3, and the length ratio of the second parts to the first parts is between 1/3 and 2.

In an exemplary embodiment, the second parts are located on the second extensions on the second data lines, or the second parts are located on both the first extensions and the second extensions on the second data lines.

In an exemplary embodiment, the second data lines and the first poles of the thin film transistors in the second pixel areas are connected with first nodes, the second data lines between two adjacent first nodes include first parts, second parts and third parts, the line width of the data lines of the second parts is smaller than that of the data lines of the first parts, the line width of the data lines of the third parts is greater than that of the data lines of the first parts, the orthographic projections of the second parts on the base substrate do not overlap with those of the compensation blocks on the base substrate, the orthographic projections of the second parts on the base substrate do not overlap with those of the gate electrodes on the base substrate, orthographic projections of the third parts on the base substrate overlap with those of the gate electrodes on the base substrate, and the first parts are parts of the second data lines except the second parts and the third parts.

In an exemplary embodiment, on the second data lines between two adjacent first nodes, the width ratio of the second parts to the first parts is between 1/3 and 2/3, the length ratio of the second parts to the first parts is between 1/3 and 2, the width ratio of the third parts to the first parts is between 4/3 and 3, and the length ratio of the third parts to the first parts is between 1/10 and 1/8.

In an exemplary embodiment, the array substrate further includes multiple compensation electrodes, the compensation electrodes and the gate lines are connected with each other to form an integrated structure, and orthographic projections of the compensation electrodes on the base substrate and orthographic projections of drain electrodes on the base substrate include overlapping areas.

An embodiment of the present disclosure further provides a display device including the array substrate described above.

Other aspects will become apparent upon reading and understanding the brief description of the drawings and embodiments of the present disclosure.

ILLUSTRATION OF REFERENCE SIGNS

10—Base Substrate; 20—Gate Line; 30—Data Line;
40—Sub-Pixel; 11—Gate Electrode; 12—First Insulating Layer;
13—Active Layer; 14—Source Electrode; 15—Drain Electrode;
21—Compensation Block; 401—Thin Film Transistor; 402—Pixel Electrode;
50—Touch Signal Line; 10a—First Pixel Area; 10b—Second Pixel Area;
301—First Extension; 302—Second Extension; 303—Pixel Accommodating Region;
3021—First Part; 3022—Second Part; 30a—First Data Line;
30b—Second Data Line; 22—Compensation Electrode; 23—First Gate Line;
24—Second Gate Line; N1—First Node; 3023—Third Part.

DETAILED DESCRIPTION

Hereinafter, embodiments will be described with reference to the drawings. Note, the embodiments may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments.

In the drawings, the size of each constituent element, or the thickness or area of a layer, is sometimes exaggerated for clarity. Therefore, an implementation of the present disclosure is not necessarily limited to the size shown, and the shape and size of components in the drawings do not reflect true proportions. In addition, the drawings schematically show ideal examples, and an implementation of the present disclosure is not limited to the shapes or values shown in the drawings.

The "first", "second", "third" and other ordinal numbers in the present specification are used to avoid confusion of constituent elements, but not to limit in quantity.

In the present specification, for convenience, words indicating orientation or position relationship such as "middle", "upper", "lower", "front", "rear", "vertical", "horizontal", "top", "bottom", "inside" and "outside" or the like are used to indicate the position relationship of constituent elements with reference to the drawings, and this is only for ease of description of the present specification and simplification of the description, rather than indicating or implying that the referred apparatus or element must have a specific orientation, or be constructed and operated in a particular orientation, and therefore this cannot be understood as a limitation on the present disclosure. The position relationship of the constituent elements is appropriately changed according to the direction in which each constituent element is described. Therefore, it is not limited to the words described in the present specification, and can be replaced as appropriate according to specific situations.

In the present specification, the terms "installed", "connected" and "coupled" shall be broadly understood unless otherwise explicitly specified and defined. For example, it may be fixedly connected, or may be removable connected, or integrally connected; it may be mechanically connected, or may be electrically connected; it may be directly connected, or may be indirectly connected through middleware, or may be internal connection between two elements. Those of ordinary skill in the art can understand the specific meanings of the above mentioned terms in the present disclosure according to specific design situations.

In the present specification, a transistor refers to an element including at least three terminals, namely a gate electrode, a drain electrode and a source electrode. A transistor has a channel region between a drain electrode (drain terminal, drain region or drain electrode) and a source electrode (source terminal, source region or source electrode), and current can flow through the drain electrode, channel region and source electrode. Note that in the present specification, the channel region refers to a region through which current mainly flows.

In the present specification, it may be a first pole as the drain electrode and a second pole as the source electrode, or it may be the first pole as the source electrode and the second pole as the drain electrode. The functions of the "source electrode" and the "drain electrode" are sometimes interchanged under the circumstance that transistors with opposite polarities are used or the circumstance that the current direction changes during circuit operation, or other circumstances. Therefore, in the present specification, "source electrode" and "drain electrode" can be interchanged.

In the present specification, "electrical connection" includes a circumstance where the constituent elements are connected together through an element having a certain electrical action. The "element having a certain electrical action" is not particularly limited as long as it can transmit and receive electrical signals between connected constituent elements. Examples of the "element having a certain electrical action" include not only electrodes and wiring, but also switching elements such as transistors, resistors, inductors, capacitors, and other elements with various functions.

In the present specification, "parallel" refers to a state in which two straight lines form an angle of −10 degrees or more and 10 degrees or less, and thus also includes a state in which the angle is −5 degrees or more and 5 degrees or less. In addition, "vertical" refers to a state in which two straight lines form an angle of 80 degrees or more and 100 degrees or less, and thus also includes a state of an angle being 85 degrees or more and 95 degrees or less.

In the present specification, "film" and "layer" can be interchanged. For example, sometimes "conductive layer" can be replaced by "conductive film". Similarly, "insulating film" can sometimes be replaced by "insulating layer".

At least one embodiment of the present disclosure provides an array substrate. The array substrate includes a base substrate, and multiple gate lines, multiple data lines, multiple compensation blocks and multiple sub-pixels located on the base substrate. The data lines are provided with multiple first extensions and multiple second extensions arranged alternately, the extending direction of the first extensions intersects with the extending direction of the second extensions, and in the same data line, any two adjacent first extensions and the second extensions between the two adjacent first extensions constitute a pixel accommodating region. The gate lines and the data lines define multiple first pixel areas and multiple second pixel areas on the base substrate, two sub-pixels are arranged in each first pixel area, one sub-pixel is arranged in each second pixel area, the multiple first pixel areas are arranged in an array, and two gate lines are arranged between any two adjacent rows of first pixel area, the multiple second pixel areas are arranged in two columns, and multiple columns of the first pixel areas are located between the two columns of the second pixel areas, and the pixel accommodating region includes at least one first pixel area or at least one second pixel area. The data lines include multiple first data lines and two second data lines, the multiple first data lines are located between the two second data lines, and projections of the second data lines on the base substrate and projections of the compensation blocks on the base substrate include overlapping areas.

Some embodiments of the present disclosure also provide a display device corresponding to the array substrate described above.

According to the array substrate provided by the above embodiments of the present disclosure, the polarity of every two sub-pixels in the same row and the polarity of adjacent sub-pixels in the same column are reversed by performing bow wiring on the data lines and compensating for the second data lines located in the edge region. Therefore, vertical stripes of alternating light and dark will not appear between columns during displaying, the power consumption of the display device will not be increased, and the charging uniformity of each sub-pixel is high, which improve the display effect of the display device.

Figure 1:
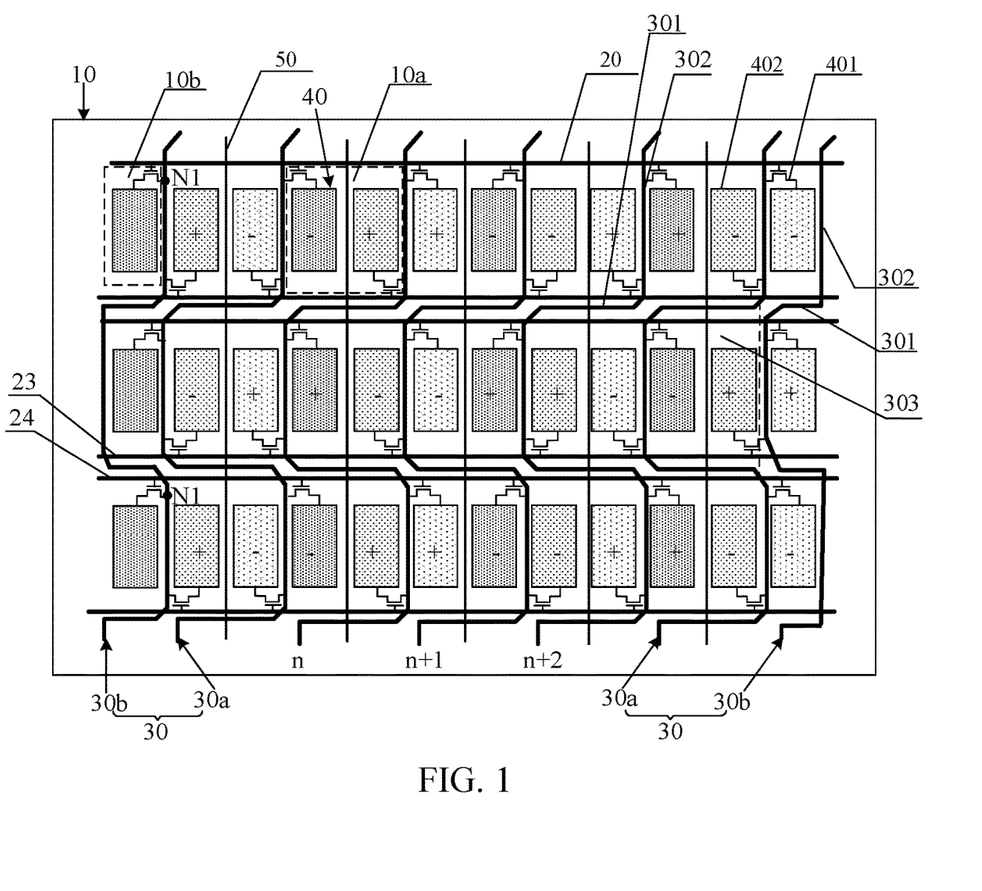
FIG. 1 is a schematic structural diagram of an array substrate in an embodiment of the present disclosure.

FIG. 1 is a schematic structural diagram of an array substrate in an embodiment of the present disclosure. As shown in FIG. 1, in this embodiment, the array substrate may include: a base substrate 10, and multiple gate lines 20, multiple data lines 30 and multiple sub-pixels 40 located on the base substrate 10, and two gate lines 20 are arranged between any two adjacent rows of sub-pixels 40.

The gate lines 20 and the data lines 30 can define multiple first pixel areas 10a and multiple second pixel areas 10b on the base substrate 10. The multiple first pixel areas 10a are arranged in an array, the multiple second pixel areas 10b are arranged in two columns, and multiple columns of the first pixel areas 10a are located between the two columns of second pixel areas 10b.

The data line 30 are provided with multiple first extensions 301 and multiple second extensions 302 arranged alternately. The extending direction of the first extensions 301 intersects with the extending direction of the second extensions 302. In the same data line 30, any two adjacent first extensions 301 and the second extensions 302 between the two adjacent first extensions 301 constitute a pixel accommodating regions 303. In the same data line 30, multiple first extensions 301 and multiple second extensions 302 can constitute multiple pixel accommodating regions 303, and two adjacent pixel accommodating regions 303 open in opposite direction. The pixel accommodating region 303 includes at least one first pixel area 10a or at least one second pixel area 10b. In an example, as shown in FIG. 1, FIG. 1 schematically illustrates an example that the pixel accommodating region 303 includes a first pixel area 10a or a second pixel area 10b. In other alternative implementations, the pixel accommodating region 303 may include two or more first pixel areas 10a or two or more second pixel areas 10b.

In an exemplary embodiment, each sub-pixel 40 may include a thin film transistor 401 and a pixel electrode 402. The pixel electrodes 402 may be electrodes made of transparent conductive material. The thin film transistors 401 may include first poles, second poles and gate electrodes. The first poles may be connected with the data lines 30, the gate electrodes may be connected with the gate lines 20, and the second poles may be connected with the pixel electrodes 402. The first pole is one of the source electrode and the drain electrode, and the second pole is the other of the source electrode and the drain electrode.

Two sub-pixels 40 are arranged in each first pixel area 10a along the extending direction of the gate lines 20. The first poles of the thin film transistors 401 included in each sub-pixel 40 are electrically connected with the pixel electrodes 402 included in the sub-pixel 40, respectively, and the second poles of the thin film transistors 401 included in the two sub-pixels 40 are electrically connected with the two data lines 30 adjacent to the first pixel area 10a, respectively. The gate electrode of the thin film transistor 401 included in each sub-pixel 40 is electrically connected with one of the two gate lines 20 adjacent to the sub-pixel 40.

One sub-pixel 40 is arranged in each second pixel area 10b. The first poles of the thin film transistors 401 included in the sub-pixel 40 are electrically connected with the pixel electrodes 402 included in the sub-pixel 40, and the second poles of the thin film transistors 401 included in the sub-pixel 40 are connected with one data line 30. The gate electrodes of the thin film transistors 401 included in the sub-pixels 40 are connected with one of the two gate lines 20 adjacent to the sub-pixel 40.

The data lines 30 include multiple first data lines 30a and two second data lines 30b, and the multiple first data lines 30a are located between the two second data lines 30b. For the multiple second extensions 302 in the first data lines 30a, each second extension 302 may be connected with the second pole of the thin film transistor 401 included in two adjacent sub-pixels 40, and the two adjacent sub-pixels 40 are located in two different first pixel areas 10a. For the multiple second extensions 302 in the second data lines 30b, a part of the second extensions 302 are connected with the second poles of the thin film transistors 401 included in two adjacent sub-pixels 40, and one of the two adjacent sub-pixels 40 is located in the first pixel area 10a and the other is located in the second pixel area 10b; the other part of the second extensions 302 is not connected with the second poles of the thin film transistors 401 included in the sub-pixels 40, and the second extensions 302 connected with the second poles of the thin film transistors 401 included in the sub-pixels are alternately arranged with the second extensions 302 not connected with the second poles of the thin film transistors 401 included in the sub-pixels. In the present application, the length of the first extensions 301 in the first data lines 30a need to be greater than that of the first extensions 301 in the second data lines 30b. In an example, the length of the first extensions 301 in the first data lines 30a is greater than the total width of two adjacent sub-pixels 40. The length of the first extensions 301 in the second data lines 30b is greater than the width of one sub-pixel 40, but smaller than the total width of two adjacent sub-pixels 40.

Figure 2:
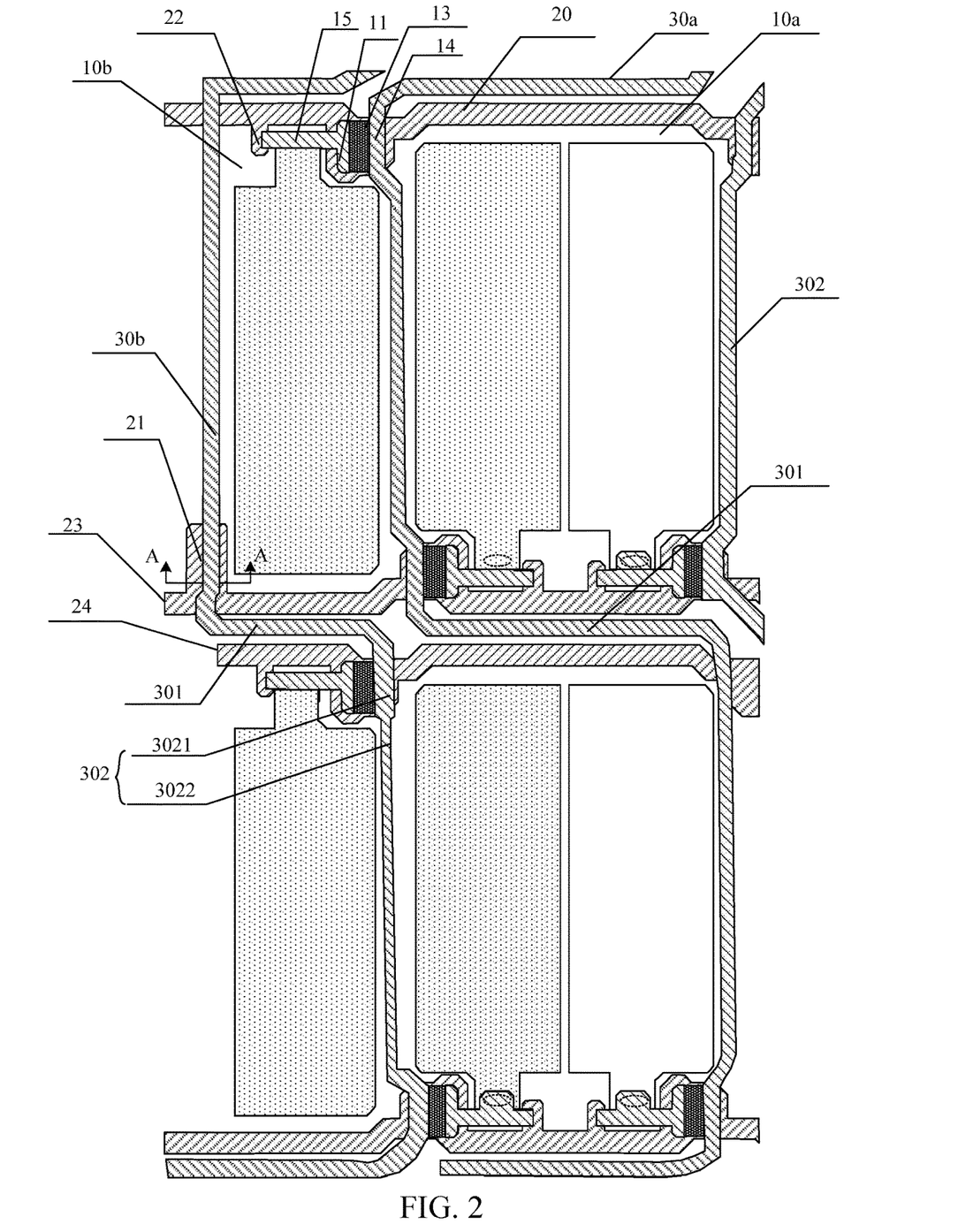
FIG. 2 is a plan view of a first pixel area and a second pixel area in an embodiment of the present disclosure.

As shown in FIG. 2, the array substrate also includes compensation blocks 21, which can be disposed on the same layer as the gate lines 20. Projections of the second data lines 30b on the base substrate 10 and projections of the compensation blocks 21 on the base substrate 10 include overlapping areas. In this embodiment, the compensation blocks 21 and the second data lines 30b constitute compensation capacitors, so that the equivalent capacitances formed by the second data lines 30b and the gate electrodes 11 are consistent with the equivalent capacitances formed by the first data lines 30a and the gate electrodes 11, thereby avoiding the display difference between the sub-pixels connected with the first column data lines and the N-th column data lines and the sub-pixels connected with other data lines.

In an exemplary embodiment, sub-pixels include first color sub-pixels R, second color sub-pixels G and third color sub-pixels B. A gate line adjacent to one side of each row of sub-pixels is connected with the first color sub-pixels R in the row and even-numbered third color sub-pixels B, and a gate line adjacent to the other side of each row of sub-pixels is connected with the second color sub-pixels G in the row and odd-numbered third color sub-pixels B.

In an exemplary embodiment, for two sub-pixels 40 in the same first pixel area 10a, the two sub-pixels 40 are two of the first color sub-pixels R, the second color sub-pixels G and the third color sub-pixels B. Sub-pixels in the same row are periodically arranged in the order of first color sub-pixels R, second color sub-pixels G and third color sub-pixels B, and sub-pixels in the same column are all the first color sub-pixels R, the second color sub-pixels G or the third color sub-pixels B. In an example, if the array substrate is assembled in a liquid crystal display panel, the first color sub-pixel R can emit red light, the second color sub-pixel G can emit green light, and the third color sub-pixel B can emit blue light.

In an exemplary embodiment, if the array substrate is assembled in a liquid crystal display panel, when the liquid crystal display panel displays, any two adjacent data lines 30 of the multiple data lines 30 in the array substrate can be loaded with voltages with opposite polarities. Thus, although for the same sub-pixels in the first pixel area of each row, the probability that any two adjacent sub-pixels have the same voltage polarity is still close to 50%, in each column of sub-pixels, two sub-pixels belonging respectively to two adjacent first pixel areas 10a have opposite voltage polarities. For example, if the pixel accommodating region 303 includes one first pixel area 10a, any two adjacent sub-pixels 40 in each column of sub-pixels have opposite voltage polarities. The voltage polarity of the same type of sub-pixels in the same frame image can be effectively averaged on the spatial scale, thereby reducing the probability of the phenomenon of mura, and further effectively improving the display effect of the liquid crystal display panel.

In an exemplary embodiment, the extending direction of the first extensions 301 in the data lines 30 is the same as that of the gate lines 20, and the extending direction of the second extensions 302 in the data lines 30 is perpendicular to that of the gate lines 20. In an embodiment of this application, the first extensions 301 of the data lines 30 are located between two gate lines 20 between two adjacent rows of first pixel areas, and the orthographic projections of the second extensions 302 on the base substrate 10 are staggered from the orthographic projections of the gate lines 20 on the base substrate, so that the parasitic capacitances generated between the data lines 30 and the gate lines 20 can be effectively reduced. It is assumed that each pixel accommodating region 303 accommodates one first pixel area 10a, and if the liquid crystal display panel needs to display after the array substrate is assembled to the liquid crystal display panel, then the n-th data line periodically drives two columns of sub-pixels connected with it in the order of the first color sub-pixel R, the third color sub-pixel B, the first color sub-pixel R and the second color sub-pixel G; the (n+1)-th data line periodically drives two columns of sub-pixels connected with it in the order of the third color sub-pixel B, the second color sub-pixel G, the first color sub-pixel R and the third color sub-pixel B; The (n+2)-th data line periodically drives two columns of sub-pixels connected with it in the order of the first color sub-pixel R, the second color sub-pixel G, the third color sub-pixel B and the second color sub-pixel G, where n is a natural number greater than or equal to 1.

In an exemplary embodiment, the array substrate may further include multiple touch signal lines 50 located on the base substrate 10. Each column of first pixel areas of the multiple columns of first pixel areas includes two columns of sub-pixels, and the touch signal line 50 is located between the two columns of sub-pixels in the same column of first pixel areas. In this application, a liquid crystal display panel manufactured with the array substrate has a touch control function through multiple touch signal lines 50 in the array substrate, so that the liquid crystal display panel can have a touch control function without separately assembling a touch panel on the liquid crystal display panel, effectively reducing the thickness of the liquid crystal display panel with the touch control function.

In an exemplary embodiment, a first gate lines 23 and a second gate lines 24 are arranged between two adjacent rows of sub-pixels 40, and the compensation blocks 21 are connected mutually with the first gate lines 23 to form an integrated structure. The gate electrodes of the thin film transistors 401 in the second pixel areas 10b are electrically connected with the second gate lines 24, and the first poles of the thin film transistors 401 in the second pixel areas 10b are electrically connected with the second data lines 30b or the first data lines 30a adjacent to the second data lines 30b.

In an exemplary embodiment, the width of the compensation blocks 21 in the extending direction of the first extensions 301 is greater than or equal to the width of the second data lines 30b in the extending direction of the first extensions 301; the length of the compensation blocks 21 in the extending direction of the second extensions 302 is greater than or equal to the length of the gate electrodes 11 in the extending direction of the second extensions 302, and the overlapping length of the compensation blocks 21 and the second data lines 30b in the extending direction of the second extensions 302 is equal to the length of the compensation blocks 21 in the extending direction of the second extensions 302.

In an exemplary embodiment, as shown in FIGS. 1 and 2, the second data lines 30b and the first poles of the thin film transistors 401 in the second pixel areas 10b are connected with first nodes N1, the second data lines between two adjacent first nodes N1 include first parts 3021 and second parts 3022, the line width of the data lines of the second parts 3022 is smaller than that of the data lines of the first parts 3021, the orthographic projections of the second parts 3022 on the base substrate 10 do not overlap with those of the compensation blocks 21 on the base substrate 10, the orthographic projections of the second parts 3022 on the base substrate 10 do not overlap with those of the gate electrodes 11 on the base substrate 10, and the first parts 3021 are parts of the second data lines except the second parts 3022. By reducing the line width of the second parts 3022 on the second data lines 30b, the equivalent resistances of the second data lines 30b are consistent with the equivalent resistances of the first data lines 30a, thus avoiding the display difference between the sub-pixels connected with the second data line 30b and the sub-pixels connected with the first data line 30a.

In an exemplary embodiment, on the second data lines 30b between two adjacent first nodes N1, the width ratio of the second parts 3022 to the first parts 3021 is between 1/3 and 2/3, and the length ratio of the second parts 3022 to the first parts 3021 is between 1/3 and 2. As an example, the width of the first parts 3021 is 4 microns, the width of the second parts 3022 is 3 microns, the width ratio of the second parts 3022 to the first parts 3021 is 3/4, and the lengths of the second parts 3022 and the first parts 3021 can be equal.

In an exemplary embodiment, the second parts 3022 can be located on the second extensions 302 on the second data lines 30b, or the second parts 3022 can be located on both the first extensions 301 and the second extensions 302 on the second data lines 30b.

Figure 3:
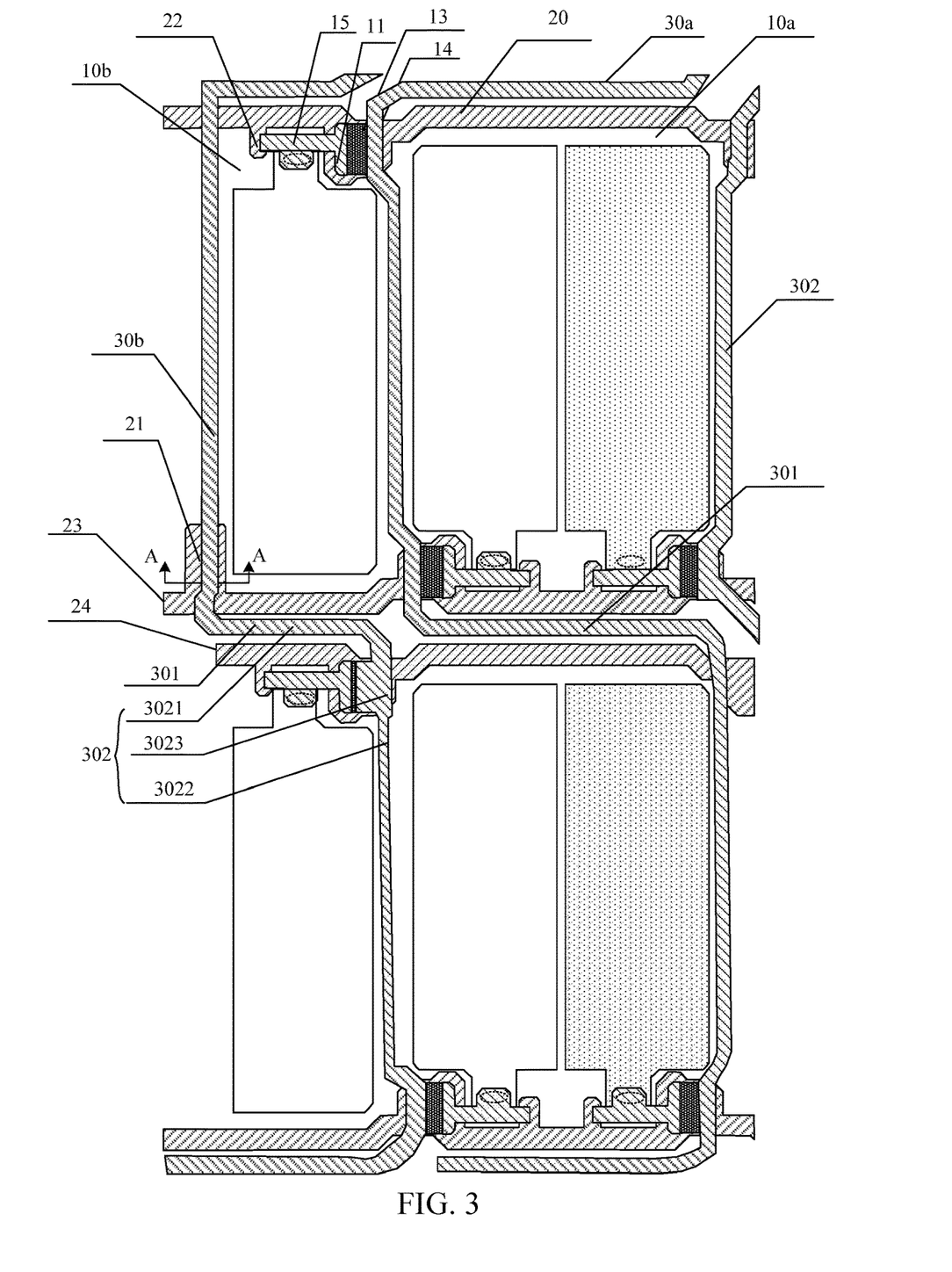
FIG. 3 is a plan view of another first pixel area and second pixel area in an embodiment of the present disclosure.

In another exemplary embodiment, as shown in FIGS. 1 and 3, the second data lines 30b and the first poles of the thin film transistors 401 in the second pixel areas 10b are connected with first nodes N1, the second data lines 30b between two adjacent first nodes N1 include first parts 3021, second parts 3022 and third parts 3023, the line width of the data lines of the second parts 3022 is smaller than that of the data lines of the first parts 3021, the line width of the data lines of the third parts 3023 is greater than that of the data lines of the first parts 3021, orthographic projections of the second parts 3022 on the base substrate 10 do not overlap with those of the compensation blocks 21 on the base substrate 10, the orthographic projections of the second parts 3022 on the base substrate 10 do not overlap with those of the gate electrodes 11 on the base substrate 10, orthographic projections of the third parts 3023 on the base substrate 10 overlap with those of the gate electrodes 11 on the base substrate 10, and the first parts 3021 are parts of the second data lines 30b except the second parts 3022 and the third parts 3023. By reducing the line width of the second parts 3022 on the second data lines 30b, the equivalent resistances of the second data lines 30b are consistent with the equivalent resistances of the first data lines 30a, thus avoiding the display difference between the sub-pixels connected with the second data line 30b and the sub-pixels connected with the first data line 30a. By increasing the line width of the third parts 3023 on the second data lines 30b, the equivalent capacitances formed by the second data lines 30b and the gate electrodes 11 are consistent with the equivalent capacitances formed by the first data lines 30a and the gate electrodes 11, thereby avoiding the display difference between the sub-pixels connected with the first column data lines and the N-th column data lines and the sub-pixels connected with other data lines.

In an exemplary embodiment, on the second data lines 30b between two adjacent first nodes N1, the width ratio of the second parts 3022 to the first parts 3021 is between 1/3 and 2/3, the length ratio of the second parts 3022 to the first parts 3021 is between 1/3 and 2, the width ratio of the third parts 3023 to the first parts 3021 is between 4/3 and 3, and the length ratio of the third parts 3023 to the first parts 3021 is between 1/10 and 1/8. As an example, the width of the first parts 3021 is 4 microns, the width of the second parts 3022 is 3 microns, the width of the third parts 3023 is 6 microns, the width ratio of the second parts 3022 to the first parts 3021 is 3/4, the width ratio of the third parts 3023 to the first parts 3021 is 3/2, the lengths of the second parts 3022 and the first parts 3021 can be equal, and the length ratio of the third parts 3023 to the first parts 3021 is 1/9.

In an exemplary embodiment, the array substrate may further include multiple compensation electrodes 22, the compensation electrodes 22 and the gate lines 20 may be connected with each other to form an integrated structure, and the orthographic projections of the compensation electrodes 22 on the base substrate 10 and the orthographic projections of the drain electrodes 15 on the base substrate 10 include overlapping areas. In an embodiment of this application, by providing the compensation electrode 22, the capacitances of the drain electrodes 15 and the gate electrodes 11 of different TFTs can still be kept consistent when the deviation in process alignment occurs between the data line layer and the gate electrode layer, that is, the compensation electrodes 22 function to compensate the equivalent capacitances Cgd formed between the gate electrode 11 and the drain electrode 15.

In an exemplary embodiment, as shown in FIG. 1, the polarities of sub-pixels 40 connected by each data line 30 are the same, and the polarities of sub-pixels 40 connected by adjacent data lines 30 are opposite.

The following describes the technical schemes of the embodiments of the present disclosure through a preparation process of an array substrate in an exemplary embodiment. The "patterning process" mentioned in this embodiment includes the procedures such as deposition of a film layer, coating of a photoresist, mask exposure, development, etching, and stripping of photoresist, and is a mature preparation process in related art. Deposition may be performed by using a known process such as sputtering, evaporation, chemical vapor deposition, or the like, coating may be performed by using a known coating process, and etching may be performed by using a known etching method, which is not limited here. In the description of this embodiment, it should be understood that "thin film" refers to a layer of thin film made of a certain material by deposition or coating processes on the base substrate. If a patterning process or a photolithography process is not needed for the "thin film" during the whole forming process, the "thin film" may also be referred to as a "layer". If a patterning process or a photolithography process is needed for the "thin film" during the whole forming process, it is referred to as "thin film" before the patterning process, and referred to as "layer" after the patterning process. The "layer" after the patterning process or photolithography process contains at least one "pattern".

(1) Forming a Pattern of a Gate Metal Layer

Figure 4:
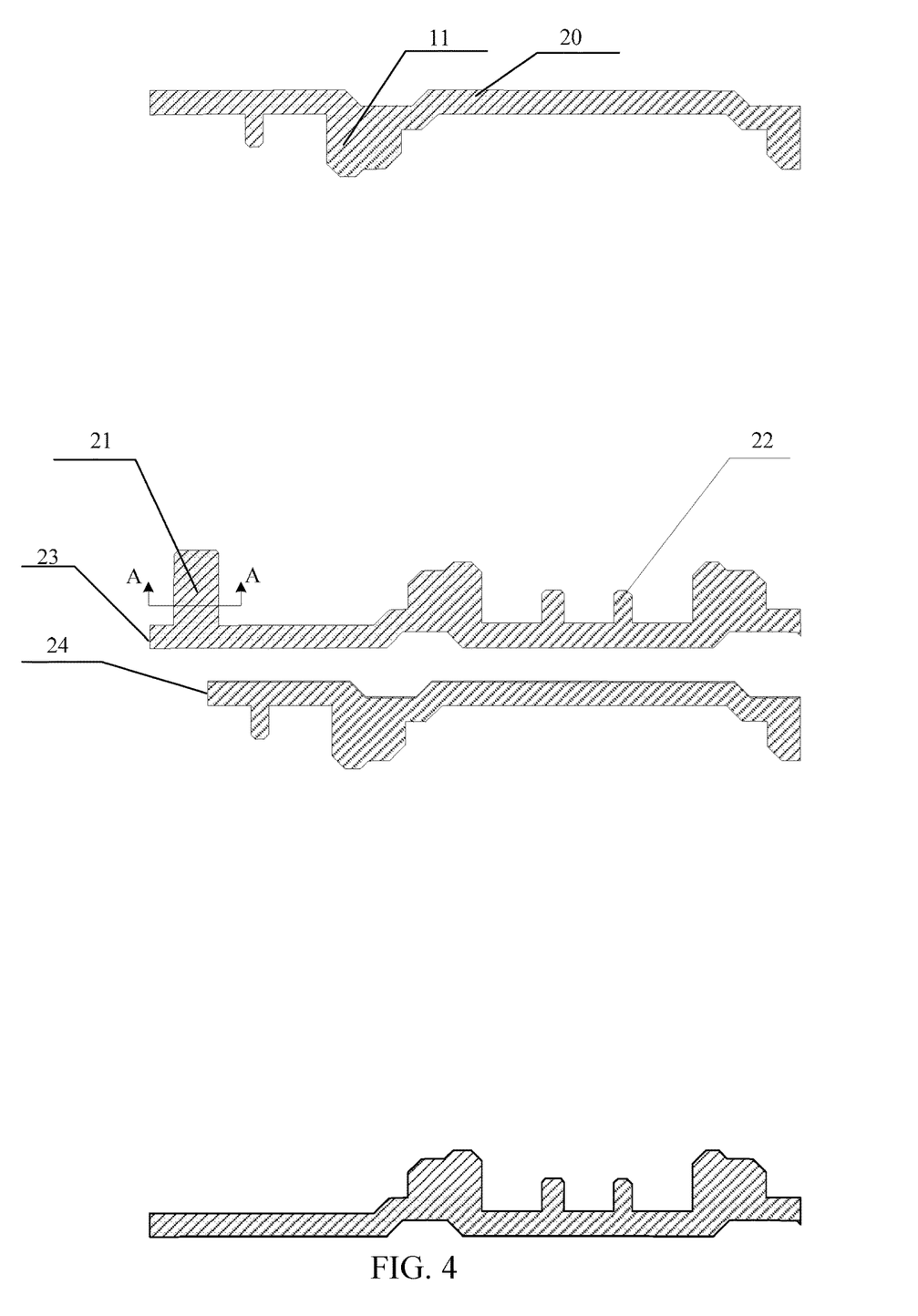
FIG. 4 is a plan view of an array substrate after a pattern of a gate metal layer is formed in an embodiment of the present disclosure.
Figure 5:
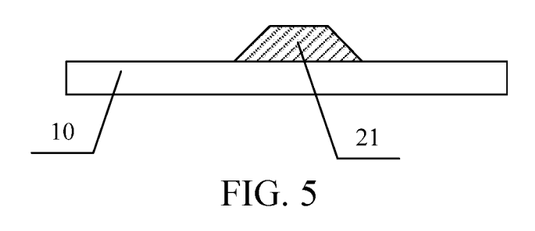
FIG. 5 is a sectional view of an A-A direction in FIG. 4.

Forming a pattern of a gate metal layer includes: depositing a first metal film on the base substrate, patterning the first metal film by patterning process, and forming patterns of gate lines 20, gate electrodes 11, compensation blocks 21 and compensation electrodes 22 on the base substrate 10. The gate lines 20, gate electrodes 11, compensation blocks 21 and compensation electrodes 22 are located in the effective display areas, and are an integrated structure, as shown in FIGS. 4 and 5. FIG. 4 is a plan view of an array substrate after a pattern of a gate metal layer is formed in an effective display area of the array substrate, and FIG. 5 is a sectional view of an A-A direction in FIG. 4.

(2) Forming a Pattern of an Active Layer

Figure 6:
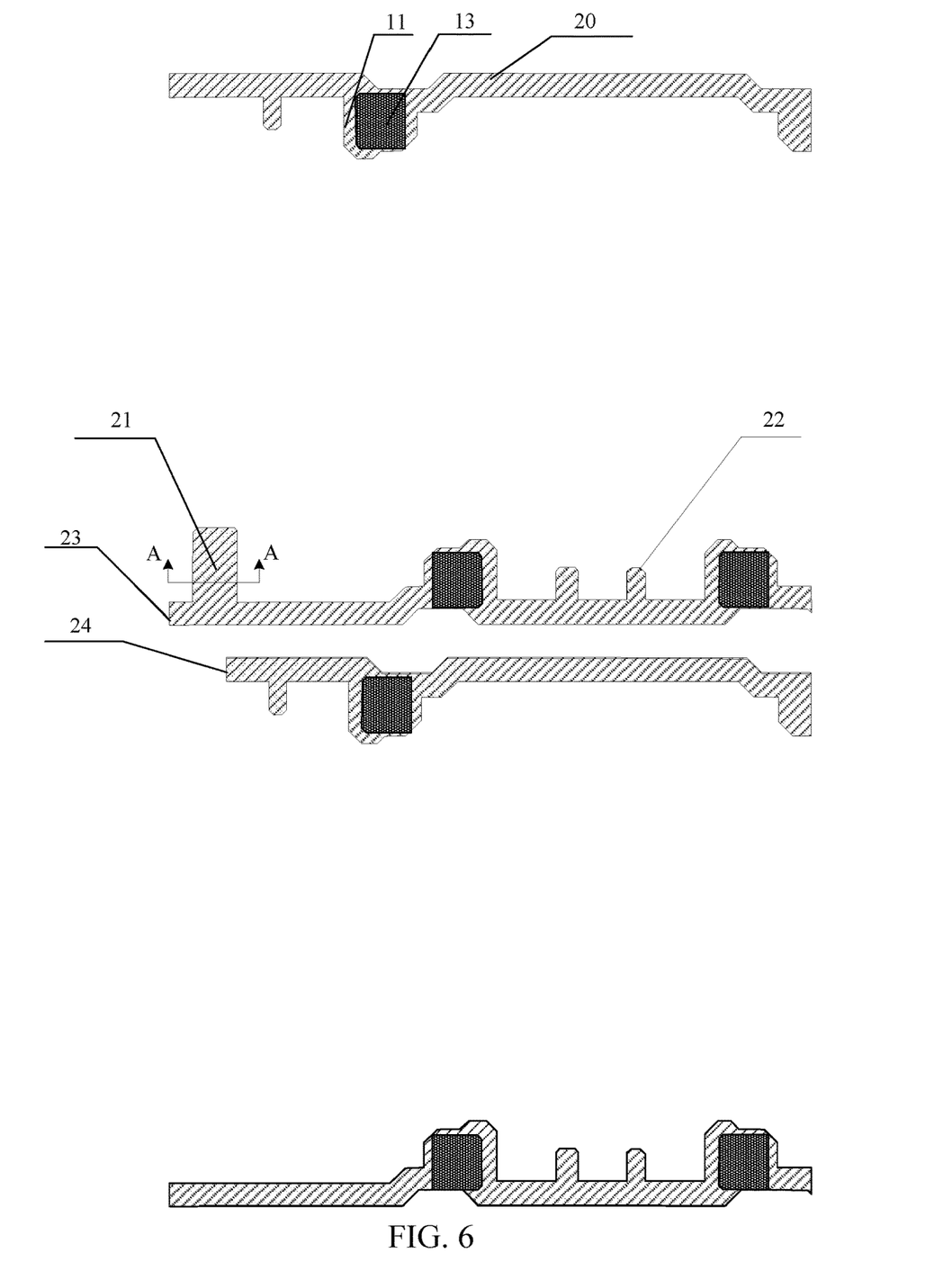
FIG. 6 is a plan view of an array substrate after a pattern of an active layer is formed in an embodiment of the present disclosure.
Figure 7:
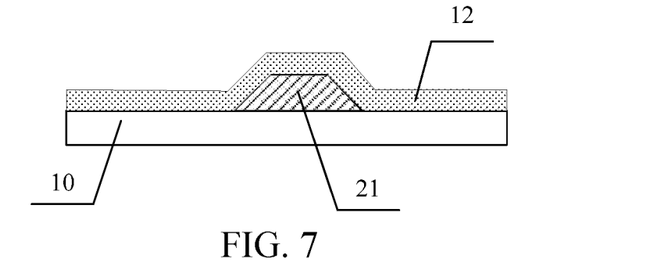
FIG. 7 is a sectional view of an A-A direction in FIG. 6.

Forming a pattern of an active layer includes: sequentially depositing a first insulating film and an active layer film on the base substrate formed with the above patterns, patterning the active layer film by a patterning process to form a first insulating layer 12 covering the pattern of the gate metal layer and to form a pattern of an active layer 13 disposed on the first insulating layer 12. The active layer 13 is located in the effective display area, and the position of the active layer 13 corresponds to the position of the gate electrode 11, as shown in FIGS. 5 and 6. FIG. 6 is a plan view of an array substrate after a pattern of an active layer is formed in an effective display area of the array substrate, and FIG. 7 is a sectional view of an A-A direction in FIG. 6.

(3) Forming a Pattern of a Source-Drain Metal Layer

Figure 8:
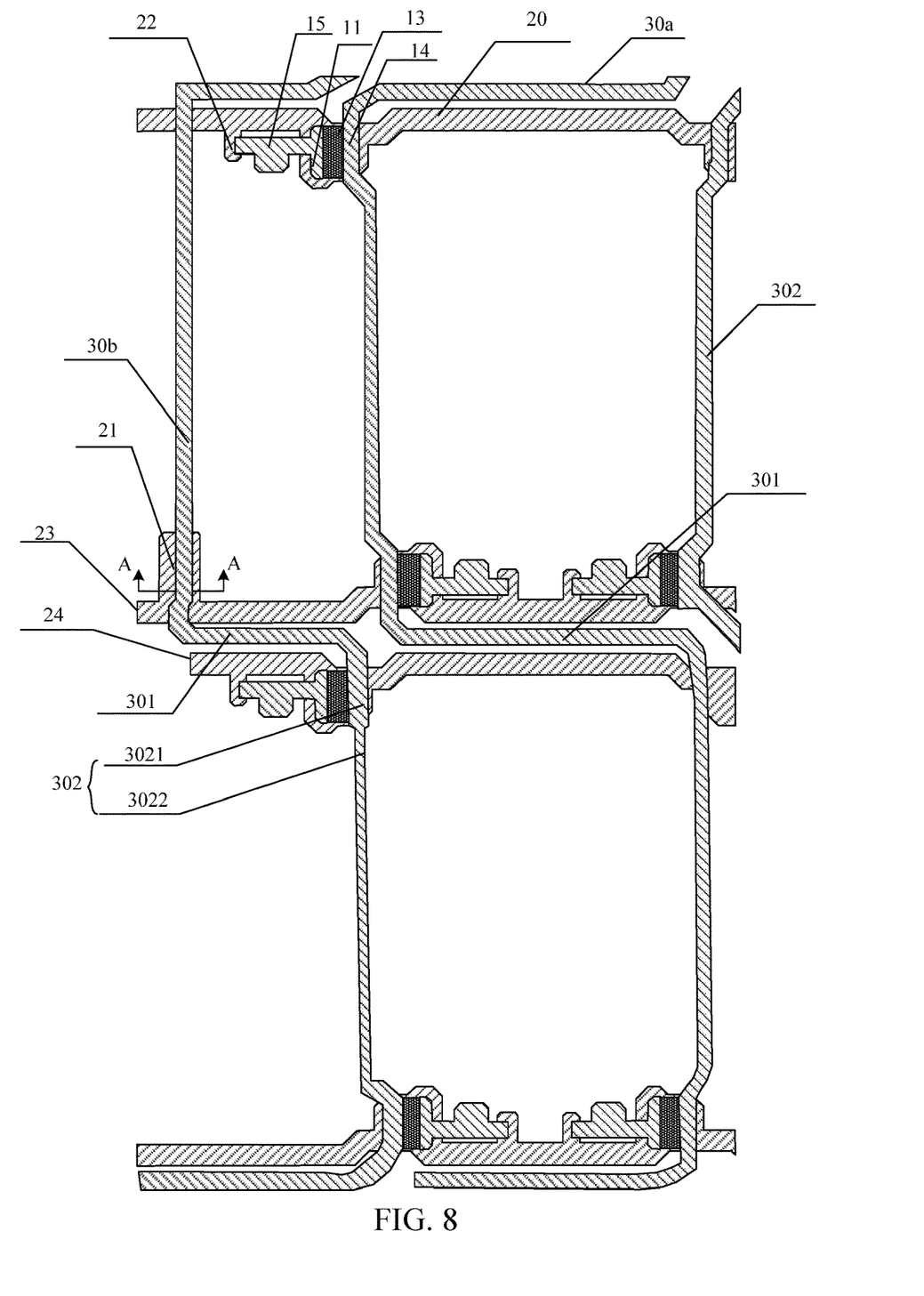
FIG. 8 is a plan view of an array substrate after a pattern of a source-drain metal layer pattern is formed in an embodiment of the present disclosure.
Figure 9:
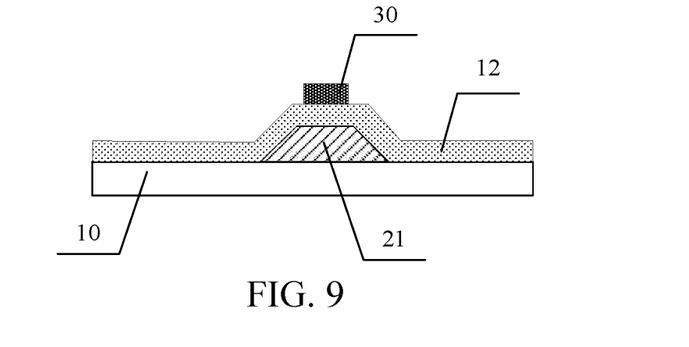
FIG. 9 is a sectional view of an A-A direction in FIG. 8.

Forming a pattern of a source-drain metal layer includes: depositing a second metal film on the base substrate formed with the above patterns, patterning the second metal film by a patterning process to form patterns of data lines 30, source electrodes 14, drain electrodes 15 and source-drain connection electrodes disposed on the first insulating layer 12. The data lines 30, the source electrodes 14 and the drain electrodes 15 are located in an effective display area, and the source electrodes 14 and the data lines 30 are connected with each other in an integrated structure. An end of source electrodes 14 adjacent to drain electrodes 15 is disposed on the active layer 13, an end of drain electrodes 15 adjacent to source electrodes 14 is disposed on the active layer 13, and conductive channels are formed between the source electrodes 14 and the drain electrodes 15. The source-drain connection electrodes are located in peripheral areas and are arranged on the first insulating layer 12. The data lines 30 include multiple first data lines 30a and two second data lines 30b, the multiple first data lines 30a are located between the two second data lines 30b, and each data line 30 has multiple first extensions 301 and multiple second extensions 302 arranged alternately. The extending direction of the first extensions 301 intersects with the extending direction of the second extensions 302. Projections of the second data line 30b on the base substrate 10 and projections of the compensation blocks 21 on the base substrate 10 include overlapping areas, thereby forming a compensation capacitor in the overlapping areas. The second data lines 30b includes first parts 3021 and second parts 3022, and the line width of the data lines of the second parts 3022 is smaller than that of the data lines of the first parts 3021, as shown in FIGS. 8 and 9. FIG. 8 is a plan view of an array substrate after a pattern of a source-drain metal layer is formed in an effective display area of the array substrate, and FIG. 9 is a sectional view of an A-A direction in FIG. 8. When the second data lines 302 includes first parts 3021, second parts 3022 and third parts 3023, the fabrication process is similar to this, except that the line width of the second data lines 302 is widened in the third parts 3023.

(4) Forming a Pattern of a Pixel Electrode Layer

Forming a pattern of a pixel electrode layer includes: sequentially depositing a second insulating film and a third metal film on the base substrate formed with the above patterns, patterning the second insulating film by a patterning process to form a second insulating layer covering the pattern of the source-drain metal layer, etching via holes on the second insulating layer to expose the surface of the drain electrodes by the via holes, patterning the third metal film by a patterning process to form a pattern of a pixel electrode layer disposed on the second insulating layer. The pixel electrode layer is located in the effective display area, and the pixel electrodes are connected with the drain electrodes in the source-drain metal layer through the via holes, as shown in FIG. 2 or 3.

In an embodiment of the present disclosure, the base substrate can be a glass substrate, a quartz substrate, a plastic substrate or a flexible substrate. The first metal film and the second metal film can be made of metal materials, such as silver Ag, copper Cu, aluminum Al, Molybdenum Mo, etc., or alloy materials of the above metals, and can have a single-layer structure or a multi-layer composite structure. The third metal film is made of aluminum Al and deposited by magnetron Sputter. The first insulating film and the second insulating film can be made of silicon oxides SiOx, silicon nitrides SiNx, silicon oxynitride SiON, etc., or of aluminum oxides AlOx, hafnium oxides HfOx, tantalum oxides TaOx, etc., can be single layer, multi-layer or composite layer, and can be deposited by chemical vapor deposition (CVD) or plasma enhanced chemical vapor deposition (PECVD). The first insulating layer may be called a gate insulating (GI) layer, and the second insulating layer may be called a passivation (PVX) layer.

In this embodiment, subsequent processes may further include forming a third insulating layer and a touch electrode layer on the pixel electrode layer. The third insulating layer can be called a flat layer, and its material can include acrylic resin or epoxy resin or the like.

In this embodiment, subsequent processes may further include forming a fourth insulating layer and a common electrode layer on the touch electrode layer. The fourth insulating layer can also be called a flat layer, and its material can include acrylic resin or epoxy resin or the like. The material of the common electrode layer includes a transparent conductive material, for example, ITO. By controlling the common electrode and the pixel electrode, an electric field is formed to drive the liquid crystal to deflect, and gray scale display is realized.

It can be seen from the above preparation process of the array substrate that the array substrate according to the embodiment of the present disclosure realizes polarity reversal of every two sub-pixels in the same row and polarity reversal of adjacent sub-pixels in the same column by performing bow wiring on the data lines, so that vertical stripes of alternating light and dark will not appear during displaying, the power consumption of the display device will not be increased, and the charging uniformity of each sub-pixel is high, which improve the display effect of the display device.

The patterning times during the array substrate preparation according to the embodiments of the present disclosure can be the same as that of the existing preparation method, so the implementation of the embodiments of the present disclosure does not need to change the existing process equipment, has good process compatibility and strong practicability, uses mature processes to solves well the problem of light and dark stripes appeared during the display of a dual gate structure, and has a good application prospect.

An embodiment of the present disclosure further provides a display device including the array substrate described above and an opposite substrate. The display device may be any product or component with a display function such as a mobile phone, a tablet computer, a television, a display, a notebook computer, a digital photo frame, a navigator, etc., and may also be wearable electronic equipment such as smart watch, smart bracelet, etc.

Although implementations disclosed in the present disclosure are as the above, the described contents are only implementations used for facilitating understanding the present disclosure, and are not used to limit the present disclosure. Any person skilled in the art to which the present disclosure pertains may make any modifications and variations in the form and details of implementation without departing from the spirit and the scope of the present disclosure, but the patent protection scope of the present disclosure shall still be subject to the scope defined in the appended claims.

What we claim is:

1. An array substrate, comprising a base substrate, and multiple gate lines, multiple data lines, multiple compensation blocks and multiple sub-pixels located on the base substrate, two gate lines being arranged between any two adjacent rows of the sub-pixels, wherein
   the data lines are provided with multiple first extensions and multiple second extensions arranged alternately, the extending direction of the first extensions intersects with the extending direction of the second extensions, and in the same data line, any two adjacent first extensions and the second extensions between the two adjacent first extensions constitute a pixel accommodating region;
   the gate lines and the data lines define multiple first pixel areas and multiple second pixel areas on the base substrate, two sub-pixels are arranged in each first pixel area, one sub-pixel is arranged in each second pixel area, the multiple first pixel areas are arranged in an array, the multiple second pixel areas are arranged in two columns, and multiple columns of the first pixel areas are located between the two columns of the second pixel areas, and the pixel accommodating region comprises at least one first pixel area or at least one second pixel area; and
   the data lines comprise multiple first data lines and two second data lines, the multiple first data lines are located between the two second data lines, and orthographic projections of the second data lines on the base substrate and orthographic projections of the compensation blocks on the base substrate comprise overlapping areas.

2. The array substrate according to claim 1, a first gate line and a second gate line being arranged between two adjacent rows of the sub-pixels; wherein
   the compensation blocks and the first gate line are connected with each other to form an integrated structure; and
   the sub-pixels comprise thin film transistors and pixel electrodes, the thin film transistors comprise first poles, second poles and gate electrodes, the pixel electrodes are electrically connected with the second poles of the thin film transistors, the gate electrodes of the thin film transistors in the second pixel areas are electrically connected with the second gate lines, and the first poles of the thin film transistors in the second pixel areas are electrically connected with the second data lines, or the first data lines adjacent to the second data lines.

3. The array substrate according to claim 2, wherein
   the width of the compensation blocks in the extending direction of the first extensions is greater than or equal to the width of the second data lines in the extending direction of the first extensions; and
   the length of the compensation blocks in the extending direction of the second extensions is greater than or equal to the length of the gate electrodes in the extending direction of the second extensions, and the overlapping length of the compensation blocks and the second data lines in the extending direction of the second extensions is equal to the length of the compensation blocks in the extending direction of the second extensions.

4. The array substrate according to claim 2, wherein
   the second data lines and the first poles of the thin film transistors in the second pixel areas are connected with first nodes,
   the second data lines between two adjacent first nodes comprise first parts and second parts,
   the line width of the data lines of the second parts is smaller than that of the data lines of the first parts,
   orthographic projections of the second parts on the base substrate do not overlap with those of the compensation blocks on the base substrate,
   the orthographic projections of the second parts on the base substrate do not overlap with those of the gate electrodes on the base substrate, and
   the first parts are parts of the second data lines except the second parts.

5. The array substrate according to claim 4, wherein on the second data lines between two adjacent first nodes, the width ratio of the second parts to the first parts is between 1/3 and 2/3, and the length ratio of the second parts to the first parts is between 1/3 and 2.

6. The array substrate according to claim 4, wherein the second parts are located on the second extensions on the second data lines, or the second parts are located on both the first extensions and the second extensions on the second data lines.

7. The array substrate according to claim 2, wherein
   the second data lines and the first poles of the thin film transistors in the second pixel areas are connected with first nodes, the second data lines between two adjacent first nodes comprise first parts, second parts and third parts, the line width of the data lines of the second parts is smaller than that of the data lines of the first parts, the line width of the data lines of the third parts is greater than that of the data lines of the first parts, orthographic projections of the second parts on the base substrate do not overlap with those of the compensation blocks on the base substrate, the orthographic projections of the second parts on the base substrate do not overlap with those of the gate electrodes on the base substrate, orthographic projections of the third parts on the base substrate overlap with those of the gate electrodes on the base substrate, and the first parts are parts of the second data lines except the second parts and the third parts.

8. The array substrate according to claim 7, wherein on the second data lines between two adjacent first nodes, the width ratio of the second parts to the first parts is between 1/3 and 2/3, the length ratio of the second parts to the first parts is between 1/3 and 2, the width ratio of the third parts to the first parts is between 4/3 and 3, and the length ratio of the third parts to the first parts is between 1/10 and 1/8.

9. The array substrate according to claim 1, further comprising multiple compensation electrodes, wherein the compensation electrodes and the gate lines are connected with each other to form an integrated structure, and orthographic projections of the compensation electrodes on the base substrate and orthographic projections of drain electrodes on the base substrate comprise overlapping areas.

10. A display device, comprising the array substrate of claim 1 and an opposite substrate.

* * * * *